United States Patent
Adlerstein et al.

(10) Patent No.: US 8,153,449 B2
(45) Date of Patent: Apr. 10, 2012

(54) MICROWAVE INTEGRATED CIRCUIT PACKAGE AND METHOD FOR FORMING SUCH PACKAGE

(75) Inventors: Michael G. Adlerstein, Wellesley, MA (US); Francois Y. Colomb, Westford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/113,317

(22) Filed: May 23, 2011

(65) Prior Publication Data

US 2011/0223692 A1    Sep. 15, 2011

Related U.S. Application Data

(60) Division of application No. 12/052,158, filed on Mar. 20, 2008, now Pat. No. 7,968,978, and a continuation-in-part of application No. 11/762,924, filed on Jun. 14, 2007.

(51) Int. Cl.
   *H01L 21/00* (2006.01)
(52) U.S. Cl. .................. 438/3; 257/E43.006
(58) Field of Classification Search .......... 438/3
   See application file for complete search history.

(56) References Cited

U.S. PATENT DOCUMENTS

| | | | | |
|---|---|---|---|---|
| 5,561,265 | A * | 10/1996 | Livshits et al. | 174/386 |
| 5,650,659 | A * | 7/1997 | Mostafazadeh et al. | 257/660 |
| 6,097,080 | A * | 8/2000 | Nakanishi et al. | 257/659 |
| 6,613,978 | B2 * | 9/2003 | Czjakowski et al. | 174/388 |
| 6,630,725 | B1 * | 10/2003 | Kuo et al. | 257/659 |
| 6,984,867 | B2 * | 1/2006 | Nakajima | 257/433 |
| 7,119,419 | B2 * | 10/2006 | Kato et al. | 257/659 |
| 7,148,084 | B2 * | 12/2006 | Strobel et al. | 438/115 |
| 7,598,597 | B2 * | 10/2009 | Guo et al. | 257/659 |
| 2002/0113300 | A1 * | 8/2002 | Dautartas et al. | 257/678 |
| 2006/0065971 | A1 * | 3/2006 | Powell et al. | 257/704 |
| 2006/0220173 | A1 * | 10/2006 | Gan et al. | 257/528 |
| 2008/0064142 | A1 * | 3/2008 | Gan et al. | 438/118 |
| 2008/0277769 | A1 * | 11/2008 | Cotte et al. | 257/659 |
| 2008/0315374 | A1 * | 12/2008 | Kim et al. | 257/659 |
| 2009/0184403 | A1 * | 7/2009 | Wang et al. | 257/659 |

* cited by examiner

*Primary Examiner* — David Zarneke
(74) *Attorney, Agent, or Firm* — Daly, Crowley, Mofford & Durkee, LLP

(57) ABSTRACT

A method for packaging a semiconductor device. The method includes: providing a dielectric layer over the semiconductor device; determining patterns and placement of material on the dielectric layer to provide a predetermined magnetic or electric effect for the device, such effects being provided on the device from such patterned and placed material solely by electrical or magnetic waves coupled between such material and the device; and forming the material in the determined patterns and placement to provide the predetermined effects.

6 Claims, 11 Drawing Sheets

|  |  | Open Cover | Magnetic Cover | $P_{Mag}/P_{Open}$(dB) |
|---|---|---|---|---|
| 32 GHz | Radiated Power (W) | 3.86E-05 | 1.04E-06 | -15.7 |
|  | Max. Intensity (W/Steradian) | 1.25E-05 | 3.06E-07 | -16.1 |
| 34 GHz | Radiated Power (W) | 3.53E-06 | 5.75E-08 | -17.9 |
|  | Max. Intensity (W/Steradian) | 2.45E-06 | 2.74E-08 | -19.5 |

MICROWAVE INTEGRATED CIRCUIT PACKAGE AND METHOD FOR FORMING SUCH PACKAGE

RELATED APPLICATIONS

This application is a divisional application of U.S. patent application Ser. No. 12/052,158 entitled MICROWAVE INTEGRATED CIRCUIT PACKAGE AND METHOD FOR FORMING SUCH PACKAGE filed on Mar. 20, 2008, which is a continuation in part of U.S. patent application Ser. No. 11/762,924, filed Jun. 14, 2007, both of which are hereby incorporated herein by reference in its entirety.

TECHNICAL FIELD

This invention relates generally to microwave integrated circuit packages and more particularly to environmentally protected microwave integrated circuit packages. This invention also relates generally to microwave integrated circuit packages and packaging methods for compensating for electromagnetic effects associated with the package.

BACKGROUND AND SUMMARY

As is known in the art, Microwave and mm-Wave Monolithic Integrated Circuits (MMICs) and devices must be protected from mechanical damage and degradation due to harsh environments. Such parts are typically mounted in hermetic housings. These housings are comprised of metallic boxes which hold not only the active MMICs but also the substrates upon which they are mounted. Techniques have been proposed to eliminate these metallic housings by using special coatings on the MMICs. Such coatings can be applied at the wafer level and therefore are potentially a low cost alternative to conventional packaging. However, coatings have not yet been shown to provide full environmental protection, nor have they been shown to avoid degradation in the performance of the MMICs in all cases.

An alternative packaging technique involves placement and bonding of air-cavity enclosures made of quartz or other materials, metalized or otherwise, over the individual die. The micro-cover, as is known in the art, results in an increase in the size of the conventional microstrip die since a bonding ring must be allowed in the design. Further, leads which emanate from the MMIC must pass under the cover and be terminated on pads placed on a ledge outside the MMIC active area. The ledge must be sufficiently large to allow access of a bonding tool for assembly.

For microstrip MMIC's designs, the active transistors and tuning elements are placed, along with bonding pads, on the top (epitaxial) surface of the die. Bond wires and associated bonding pads within a conventional housing result in an increase in the size of the MMIC as well as an increase in the cost and complexity of the substrates to which they are mounted. In prior art, techniques have been proposed to reduce or eliminate the bond wires by providing through-via connections from the front surface of a MMIC to the back surface. This technique is sometimes referred to as "Through-Wafer-Interconnect", "Hot-Via" or "Direct-Backside-Interconnect". Hot-via designs allow for smaller die and smaller substrates and hence smaller module footprints. Hot-via designs make it easier to route wiring on the MMIC since connection need not be made at the edges of the chip.

A further issue relating to the use of MMIC's within modules along with other components relates to tuning effects due to module walls and nearby components.

It is know in the art that a combination of Hot-Via and Micropackage designs can produce a leadless, hermetically sealed micro-package. The micro-cover is used to hermetically seal the MMIC. The MMIC itself forms the bottom of the package while all of the interconnections are made by the hot-via approach. Thus no leads or bonding pads are needed anywhere on the chip. The need for a ledge is eliminated and a hermetic package is produced thereby reducing the chip size.

In accordance with the invention, a method is provided for packaging a semiconductor device. The method includes: providing a dielectric layer over the semiconductor device; determining patterns and placement of material on the dielectric layer to provide a predetermined magnetic or electric effect for the device, such effects being provided on the device from such patterned and placed material solely by electrical or magnetic waves coupled between such material and the device; and forming the material in the determined patterns and placement to provide the predetermined effects.

In one embodiment, the method includes: mounting a rigid dielectric layer over the semiconductor device, such rigid material being suspended over the device; determining patterns and placement of materials on the dielectric layer to provide a predetermined magnetic or electric shielding for the device; depositing the material, including resistive, metallic, dielectric, magnetic material or any combination thereof, on the rigid dielectric layer; and patterning the deposited material to provide the predetermined shielding.

In one embodiment, a method for packaging a plurality of semiconductor devices formed in a surface portion of a semiconductor wafer, each one of a plurality of regions within the wafer having one of the semiconductor devices therein, such method comprising: providing a dielectric layer over the wafer; depositing a material on the dielectric layer, such material effecting electromagnetic fields on each one of the devices; separating each one of the devices within the wafer.

In accordance with one embodiment, a method is provided for reducing or eliminating electromagnetic interactions between the MMIC and the external environment within a module enclosure. The method involves forming metallic, dielectric or magnetic material structures on the inside and/or outside surfaces of the cover. These structures terminate radiated fields in a known and predictable manner thereby providing shielding and/or feedback reduction to the MMIC.

In accordance with one embodiment, a method is provided for packaging a semiconductor device. The method includes: designing a microwave integrated circuit for the package; creating a computer model of selected package with the designed microwave integrated circuit therein for electromagnetic simulations; generating simulations with the created computer model without electromagnetic structures to define a baseline performance; applying a plurality of different electromagnetic structures to the created model; performing a simulation for each one of the plurality of different electromagnetic structures measuring one of more of the following performance factors: gain, RF emission, feedback gain ripple; and comparing the simulated performance with the baseline performance; and; selecting one of the plurality of different electromagnetic structures.

In one embodiment, the structures for the package include resistive, metallic, magnetic or dielectric material.

In one embodiment, a package for a semiconductor device is provided comprising: a dielectric layer disposed over the semiconductor device; and magnetic material disposed on selected regions of the rigid dielectric layer.

In one embodiment, the dielectric layer is a rigid dielectric layer suspended over the device.

In a further embodiment an environmental coating is disposed on the MMIC. This forgoes the need for hermetic sealing of the microcover. Instead, the MMIC is coated with an environmentally impervious coating at the wafer level prior to attachment of the microcover.

Thus, the packaged MMICs have microwave properties that are independent of placement in modules. In accordance with the invention, metallic, dielectric or magnetic material shapes or features (electromagnetic structures) are printed or lithographically patterned on the inside or outside surfaces of the micro package. Electromagnetic structures are designed to prevent electromagnetic interaction between the MMIC with the external module environment into which the packaged device is mounted. Instead, electromagnetic structures on the microcover are accounted for in the design of the MMIC. They prevent unwanted interactions through the shielding they provide. The result of the packaging method is an invariant die, both in properties and performance. Thus, the need for hermetic sealing of the microcover may be removed since, instead, the MMIC is coated with an environmentally impervious coating prior to attachment of the microcover.

The electromagnetic structures not only prevent unwanted interaction between the MMIC and the external module environment but they also enable MMICs with more gain since the electromagnetic structures can be designed to reduce or control coupling and feedback inside the MMIC.

The details of one or more embodiments of the invention are set forth in the accompanying drawings and the description below. Other features, objects, and advantages of the invention will be apparent from the description and drawings, and from the claims.

DESCRIPTION OF DRAWINGS

Reference symbols in the various drawings indicate like elements.

DETAILED DESCRIPTION

Figure 1:
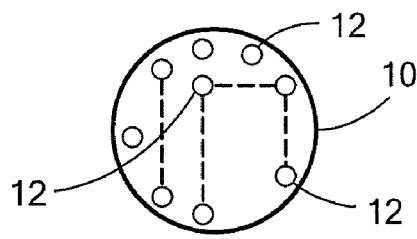
FIGS. 1 through 12 show a semiconductor wafer having devices therein packaged in accordance with the invention at various steps in such packaging.
Figure 2:
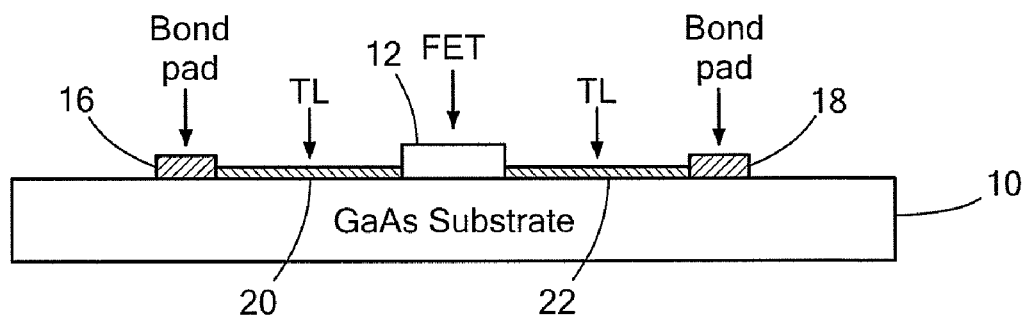
Figure 3:
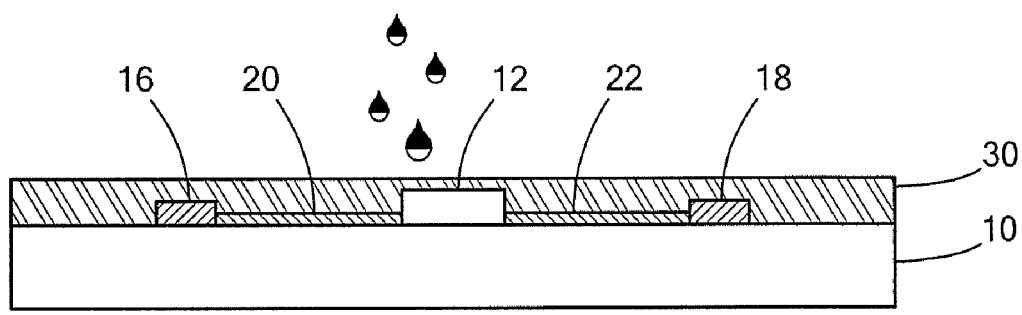

Referring now to FIG. 1, a semiconductor wafer 10 is shown having a plurality of semiconductor devices 12 formed in a surface portion thereof, here the upper surface portion thereof, is shown. An exemplary one of the devices 12 is shown in FIG. 2. Thus, here the wafer is for example, a GaAs wafer 10, and the devices are, for example, field effect transistors (FETs) each one being connected to bond pads 16, 18 through transmission lines 20, 22 respectively, as shown, Next, a lithographically processable, etchable material 30 is deposited over the upper surface portion of the semiconductor wafer 10, as shown in FIG. 3. Here, for example, lithographically processable, etchable material 30 can be an organic or inorganic material, that can be easily patterned on a wafer using conventional lithographic and etch process to form the sidewall of a cavity to be described. In one embodiment, Benzocyclobutane (BCB) is used being a dielectric material with excellent electrical properties. It has been used in many applications for dielectric coating, 3D interconnect and packaging, see for example, Kenjiro Nishikawa, Suehiro Sugitani, Koh Inoue, Kenji Kamogawa, Tsuneo Tokumitsu, Ichihiko Toyoda, Masayoshi Tanaka, "A Compact V-Band 3-D MMIC Single-Chip Down-Converter Using Photosensitive BCB Dielectric Film", *IEEE Transactions on Microwave Theory and Techniques*, vol. 47, No. 12, Dec. 1999, and Rainer Pelzer, Viorel Dragoi, Bart Swinnen, Philippe Soussan, Thorsten Matthias, "Wafer-Scale BCB Resist-Processing Technologies for High Density Integration and Electronic Packaging", 2005 International Symposium on Electronics Materials and Packaging, Dec. 11-14.

The BCB material 30 can be dispensed as a liquid, spun on, exposed, developed and cured, all using conventional semiconductor fabrication equipment. Because BCB can be patterned by conventional photolithographic technique, it can achieve alignment tolerances and critical dimensions similar to that of photoresist (limited by film thickness). A spin-on process is preferable to a lamination process (such as that for LCP) from a mechanical and process simplicity standpoint. The spin-on process introduces less stress to the wafer, especially for the mechanical fragile structures such as air bridges and is more capable of self leveling over complex circuit topologies.

Figure 4:
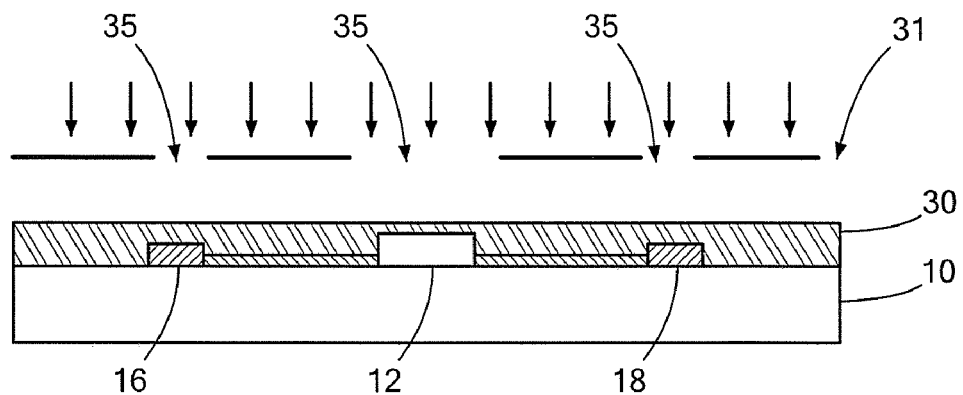
Figure 5:
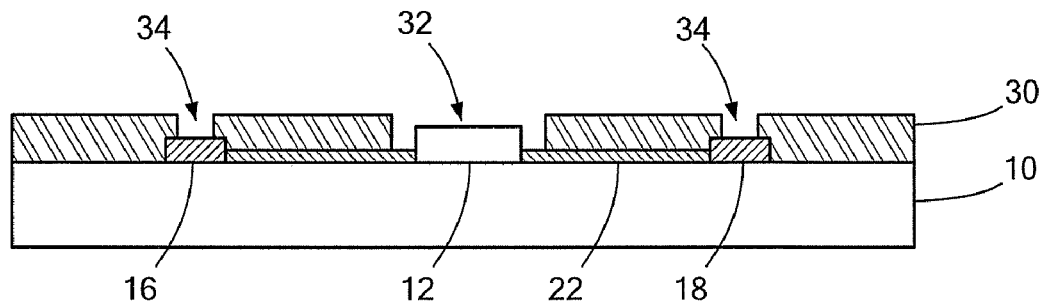

Next, the material 30 is photolithographically processed, as shown in FIG. 4, using a mask 31 having windows 35 disposed over the devices 12 and contact pads 16, 18. After exposed portions of the BCB material 30 are developed away, device openings 32 therein to expose the devices 12 and electrical contacts pads openings 34 therein to expose electrical contact pads 16, 18 as shown in FIG. 5.

Figure 6:
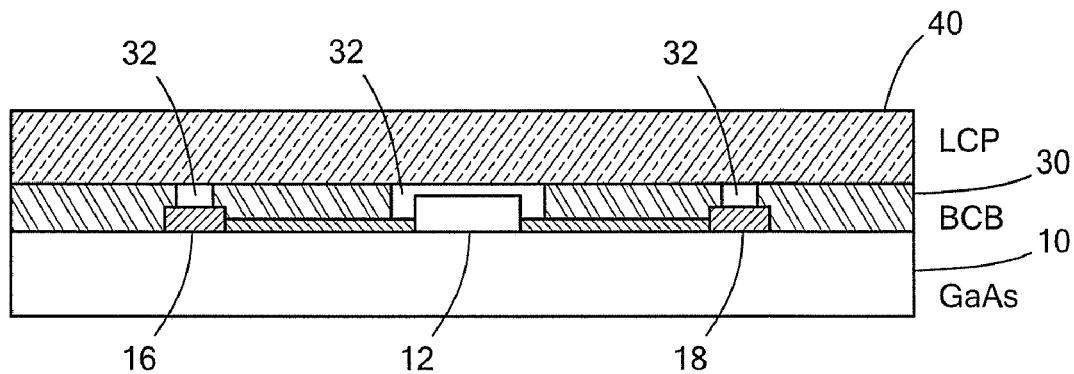

After patterns are formed on the BCB material 30, the openings or cavities 32 are enclosed using a mechanically strong, i.e., rigid self-supporting layer 40 that has good adhesion to BCB material 30. One material for layer 40 is LCP, which can be laminated over the BCB material 30, as shown in FIG. 6. Material 30 should be sufficiently thick so that layer 40 does not directly touch the device 12. The lamination can be done to create either an air or vacuum cavities 32.

Figure 6A:
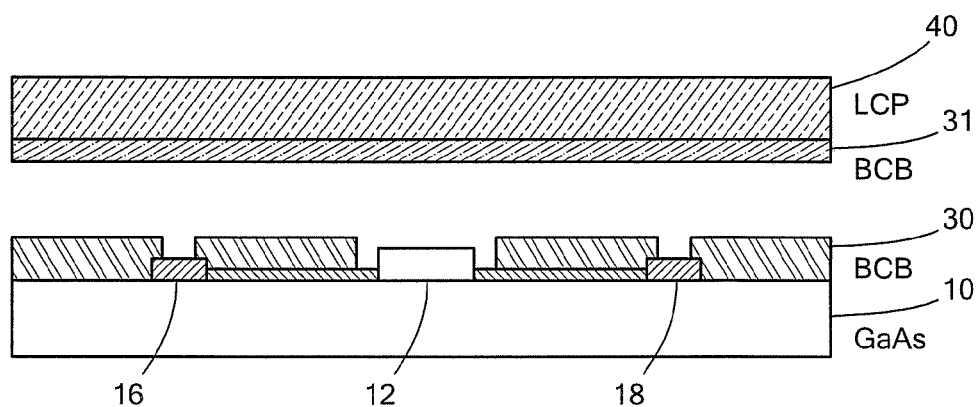
Figure 6B:
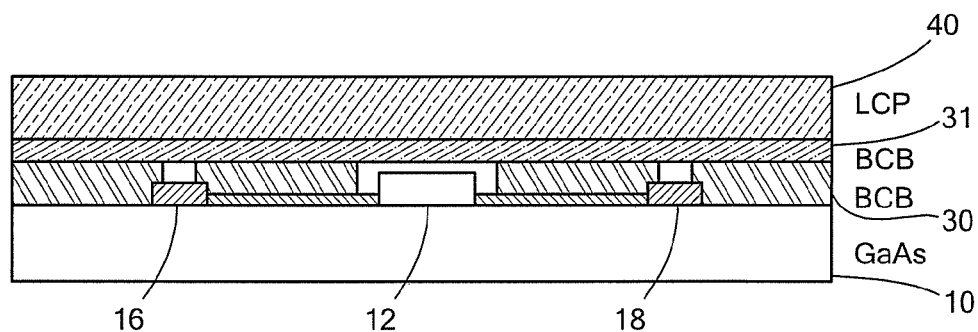

If LCP adhesion to BCB is difficult to achieve at a safe processing temperature for the semiconductor device, a thin layer of BCB material 31 as shown in FIGS. 6A and 6B can be spun on the LCP material 40, cured at sufficient temperature to achieve good adhesion and then bonded to the BCB material 30 on the wafer. Generally, it is easier to create adhesion between similar materials than dis-similar materials.

To make electrical connections to the circuit devices 12, laser ablation can be used to remove portions 54 (FIG. 7) of the LCP material 40 and/or BCB material 30 to expose the bond pads 16, 18. Thus, the process forms electrical contact pad openings 32 in portions of the rigid dielectric layer 40 disposed over electrical contact pads 16, 18 of the devices 12 with other portions 53 of the rigid dielectric layer 40 remaining suspended over the device openings 32 in the material 30.

Figure 7:
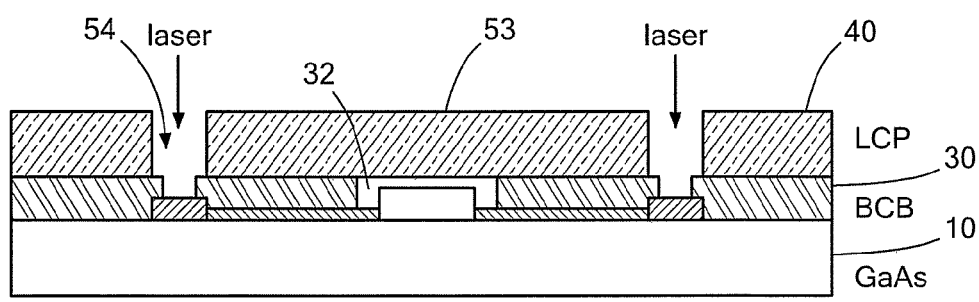

Here, the bond pads 16, 18 can be left exposed for wire bonding as shown in FIG. 7. In addition, metal 80 may be plated over the structure as shown in FIG. 8, such metal 80 being deposited on side walls of the openings formed in layer 40 and material 30 onto the exposed upper portions of the contact pads 16 and 18.

Figure 9:
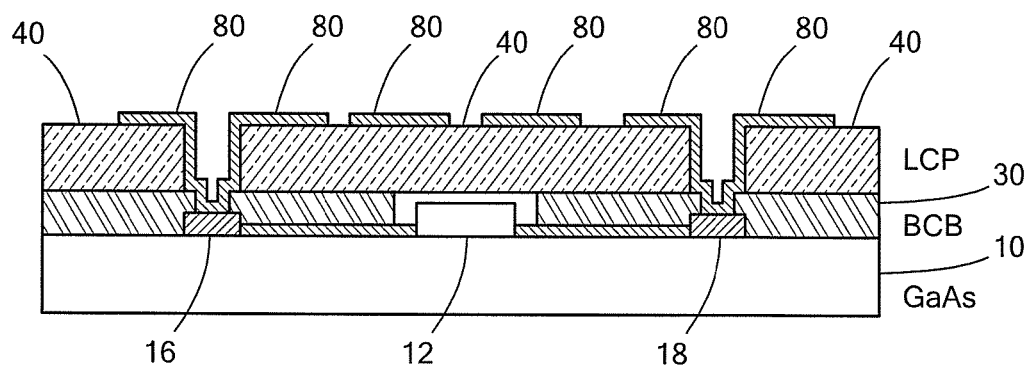
Figure 10:
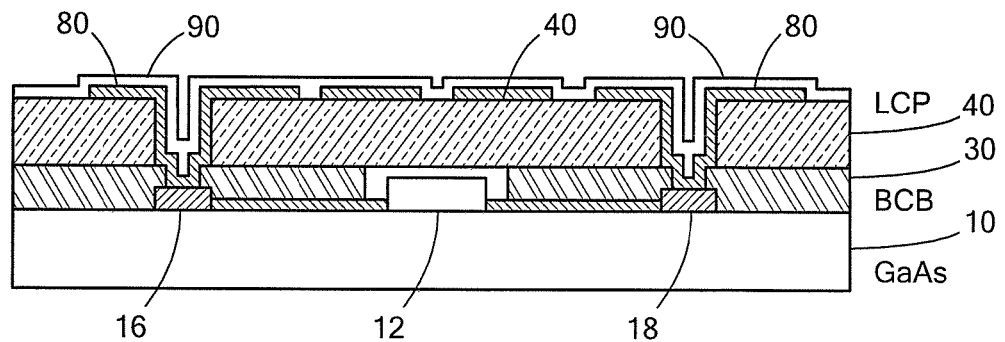

Next, the metal 80 may be patterned for additional contacts or structures, as shown in FIG. 9. Next, environmentally robust coating 90 can be applied and patterned unto the wafer to provide comparable environmental protection to that of hermetic modules, as shown in FIG. 10. Then the process continues in any conventional manner, for example, by thinning the backside of the wafer and dicing the devices into individual; now packaged chips.

Figure 8:
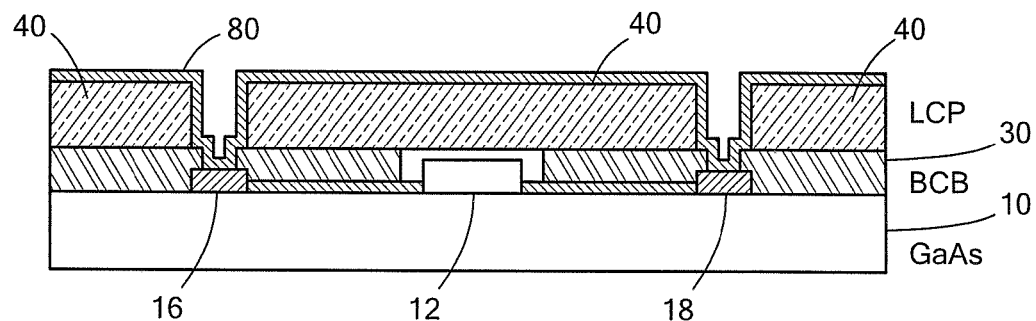
Figure 11:
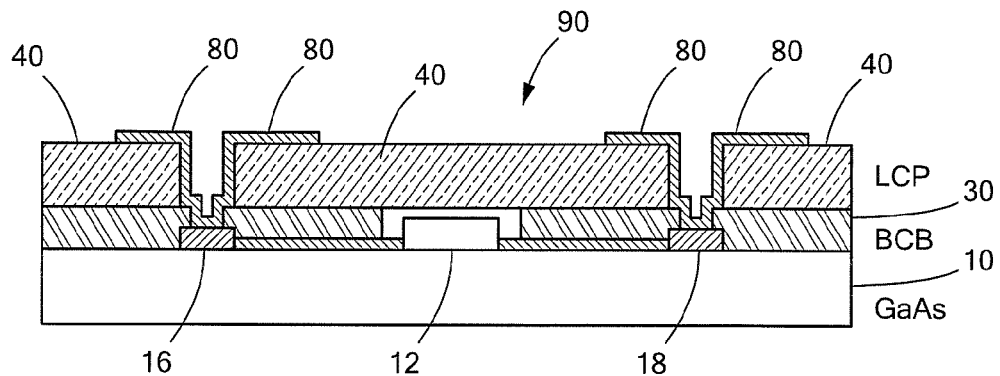
Figure 12:
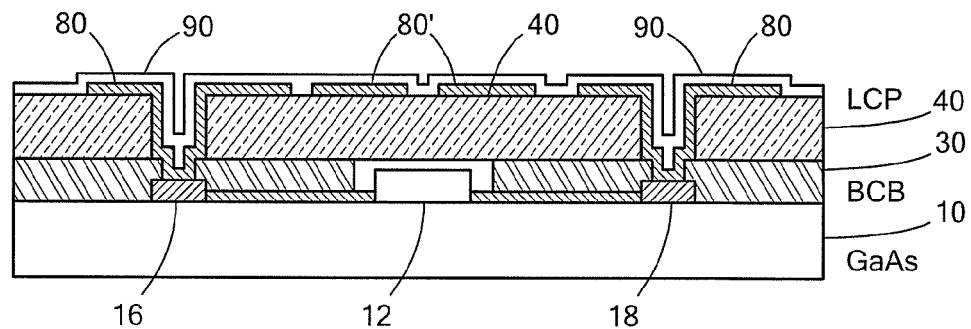

Referring now to FIG. 11, in this embodiment, after forming the structure shown in FIG. 8, the metal 80 is removed from the upper surface of the LCP material 40 in the region 90 between the contacts 16, 18, as shown. Next, a dielectric material, or magnetic material or conductive material is formed over the structure and photolithographically patterned in regions 80', as shown in FIG. 12. Thus, the metallic, dielectric or magnetic material shapes 80' or features (electromagnetic structures) are printed on the outside surfaces of the micro package (i.e., here on the outside surface of the LCP material 40). It should be understood that the shapes 80' may have been formed on the inside surface of the LCP material 40 prior to bonding the LCP material 40 in the step shown in FIG. 6A. These materials shapes 80' are electromagnetic structures designed to prevent electromagnetic interaction between the MMIC with the external module environment into which the packaged device is mounted.

Figure 13:
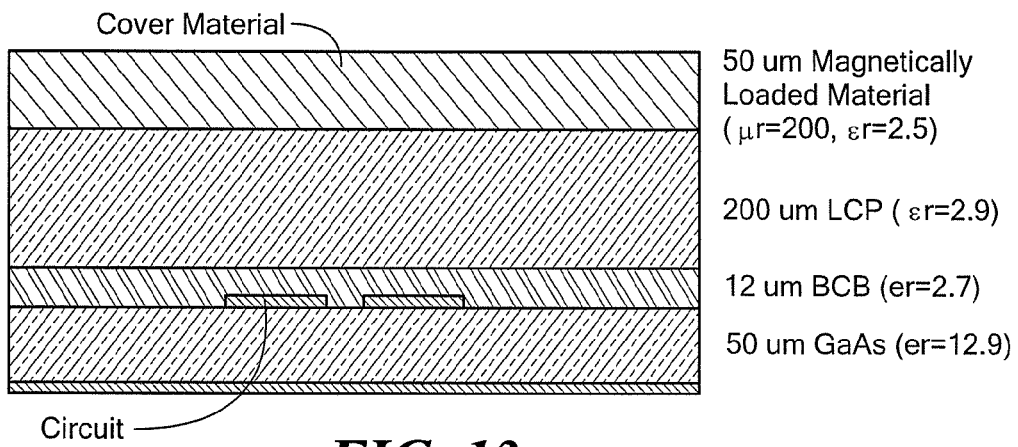
FIG. 13 is a package using the method of FIGS. 1-12 with a coupled line filter with microstrip circuit on a GaAs substrate with magnetically loaded cover material according to the invention.

In one embodiment, shown in FIG. 13, a 50 um layer of dielectric loaded with a magnetic material is formed on the upper surface of the LCP cover to shield a coupled line filter. Radiation from the filter into free-space is reduced by 15 to 20 dB as shown in the results of a method of moments numerical simulation in FIG. 14. (It is to be noted that the material and data shown and described in connection with FIGS. 14-20 are based on numerical electromagnetic analysis.)

Figures 14, 15:
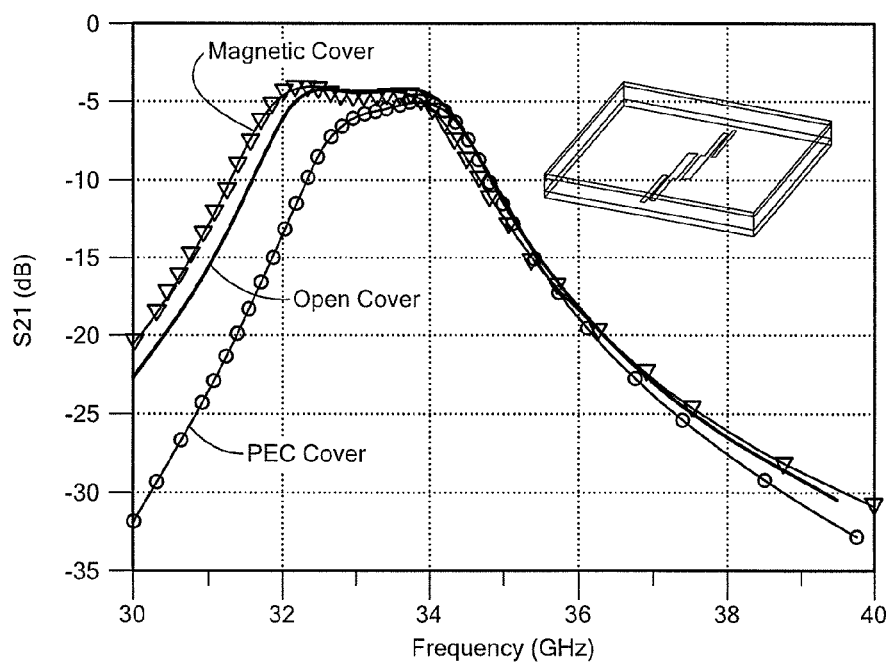
FIG. 14 is a table comparing radiating power and maximum field intensity for a package without a cover and the package of FIG. 13 with a cover having magnetic loaded material to suppress radiation of the coupled line filter by 15 to 20 dB while preserving the original pass-band response of the filter in accordance with the invention.
FIG. 15 are frequency responses of the package of FIG. 13 without a cover (Open Cover), with a cover in accordance with the invention (Magnetic Cover); and with a totally perfect electrical conductive (PEC) cover (PEC Cover)

Moreover, the frequency response of the filter remains unaffected by the addition of the magnetic layer as shown in FIG. 15. In contrast, the metallic (PEC) cover de-tunes the filter significantly. An alternative method of shielding known in the art is to cover the top surface of the package with a metal conductor. While it can provide very good shielding, this method produces significant distortion of the filter response compared to the case without the conductive layer, as seen in FIG. 15. The filter could be re-designed to restore the passband. Alternatively, the effect of the conductive cover could be taken into account from the start of the design. In the invention, materials and their shapes are designed to achieve improved performance such as integrated package shielding without detuning of the microwave circuits inside the package.

In addition to shielding, a second desirable feature of the electromagnetic structures formed on the cover is the ability to reduce electromagnetic coupling between different parts of a circuit. Coupling tends to distort performance and add risk in a design. It is often impractical to simulate coupling beyond a narrow rim of adjacent components due to the inherent complexity of microwave circuits and the limitations of current computers. The invention reduces coupling by modifying the field structure and confining the fields to a small region around the sources of the field, thereby leading to improved circuit performance and reduced design cycle time.

Figure 16:
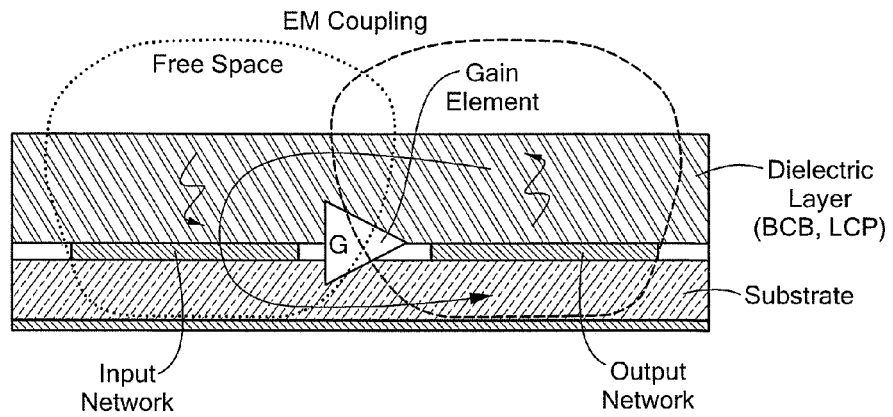
FIG. 16 is an amplifier circuit packaged in the package of FIG. 13 showing energy coupled from an output network of the circuit back to an input network of the circuit through the near field feedback.

An important application of the invention, but not limited to, is microwave amplifiers. It is known in the art that feedback from output to input can produce undesirable ripple or oscillations that degrade performance and in some cases render an amplifier completely useless. The magnitude of these effects increases with loop gain which is to first order proportional to the product of amplifier gain and reverse isolation. In the case of multistage MMIC amplifiers, reverse isolation is dominated by electromagnetic coupling between the different parts of the circuit, in particular between the input matching network and the output matching network of the amplifier as shown in FIG. 16. Amplifier configuration with upper halfspace above the circuit consisting of dielectric and free space. Energy is coupled from the output network back to the input network through the near field resulting in undesirable feedback effects. The circuit is also susceptible to the effect of coupling to the environment.

Figure 17:
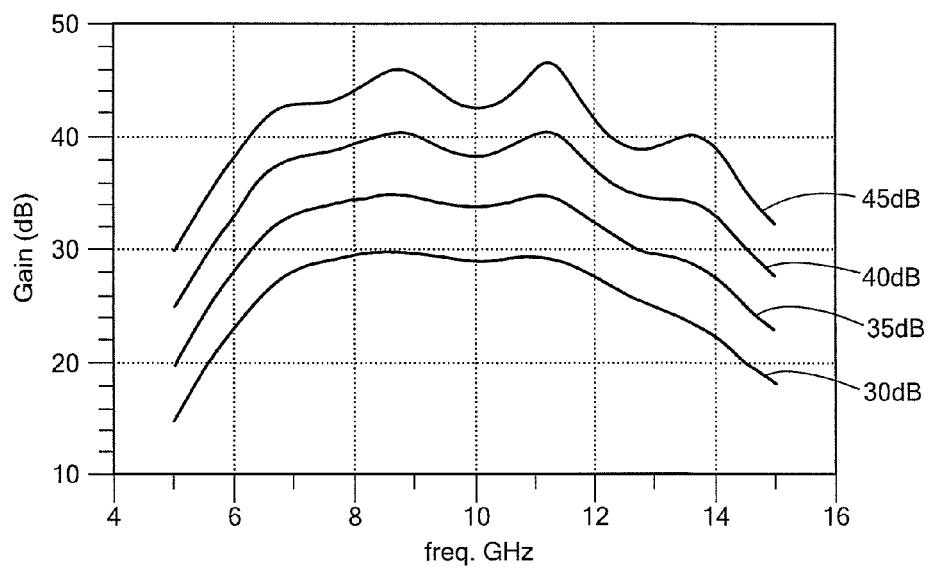
FIG. 17 shows feedback affected gain of the packaged amplifier circuit of FIG. 16 for various amplifier circuit gains.

Since coupling depends on the proximity and orientation of the conductors in the environment of the package, reverse isolation is to a large extent determined by the circuit packaging technology. For a nominal level of acceptable feedback, this means that each circuit packaging technology has an associated maximum amplifier gain. Beyond that gain the effects of feedback grow rapidly and become intolerable, as shown in FIG. 17. EM Coupling feedback produces gain ripple. The ripple increases with nominal gain of the amplifier causing large variations in performance across the band and susceptibility to amplifier oscillation.

Figure 18:
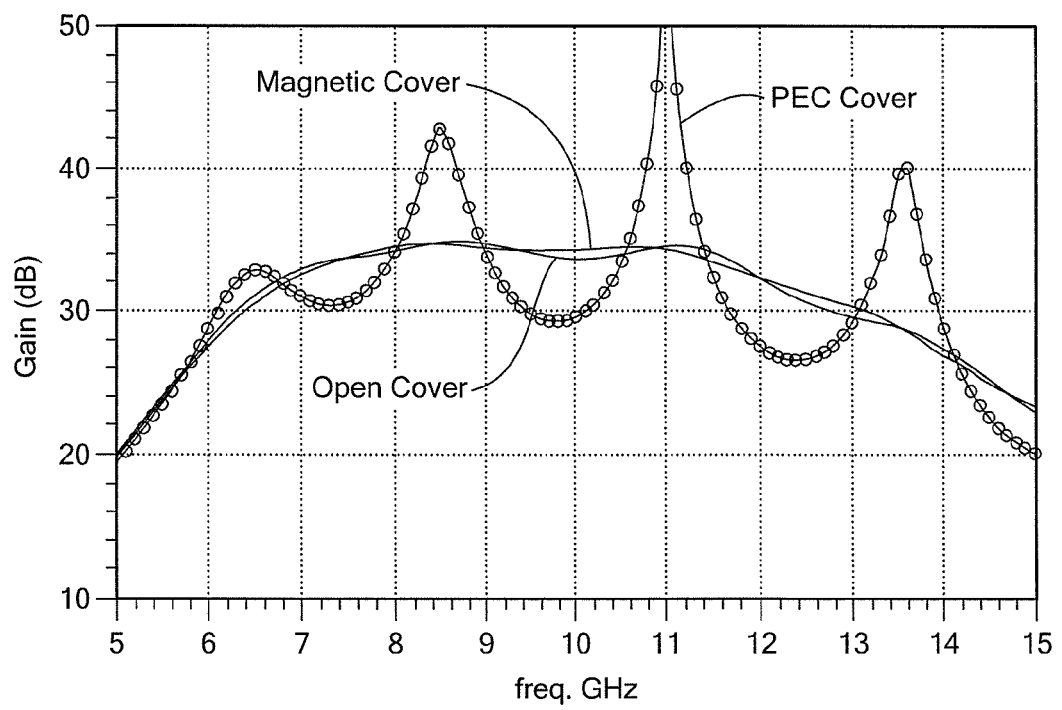
FIG. 18 shows a comparison of amplifier gains for three types of package covers: a free space open cover; a cover with perfect electric conductor (PEC), and a cover with magnetic loaded material according to the invention.

In one embodiment of the invention, a layer of magnetic loaded material is formed on the upper surface of the LCP cover. The presence of this layer reduces significantly amplifier feedback, as shown in the finite element simulation results of FIG. 18. In FIG. 18 the gains of amplifiers with three different boundary conditions at the upper surface of the LCP layer are compared. Here, a baseline structure for comparisons to be described is a so-called open cover case where the package has a dielectric cover, here the LCP cover, but without any electromagnetic compensation structures on the LCP cover; that is, the outer surface of the LCP cover is exposed to free space. As shown in FIG. 18, a comparison of amplifier gains for three types of upper boundaries is shown: one boundary is the open cover; a second is with a perfect electric conductor (PEC) over the entire LCP cover; and the third is with a magnetic loaded material over the entire LCP cover. As shown in FIG. 18, the PEC cover intensifies the effects of feedback coupling while the cover with magnetic loaded material suppresses the feedback coupling.

Figure 19:
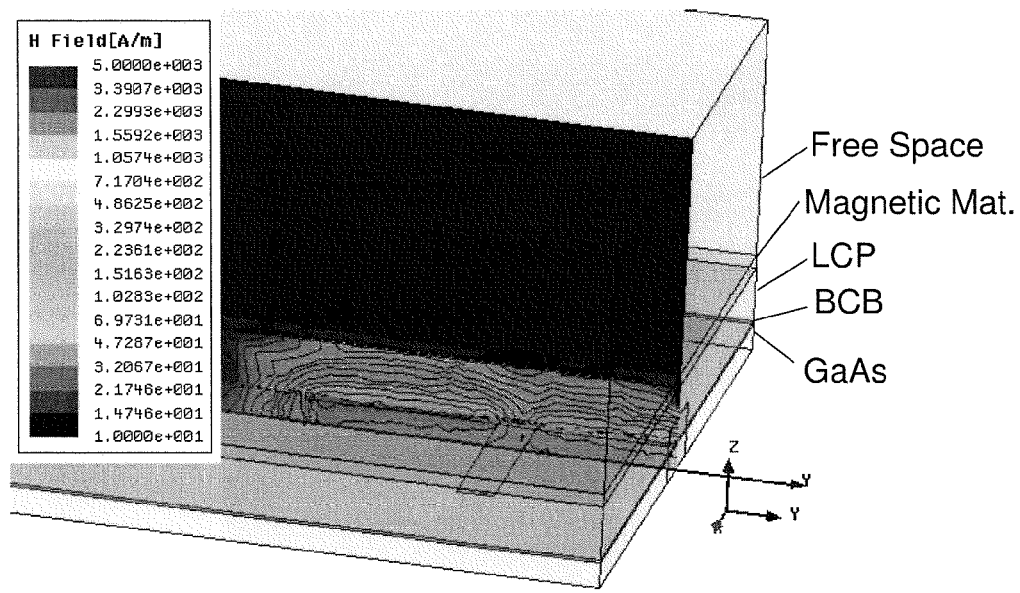
FIG. 19 shows simulations of H field of the amplifier circuit showing confinement of magnetic field within the integrated microwave package of FIG. 18 with magnetic cover, where here the layers above the amplifier circuit are BCB, LCP, magnetic loaded material ($\mu r=200$, $\in r=2.5$, thickness=50 um), and free space.
Figure 20:
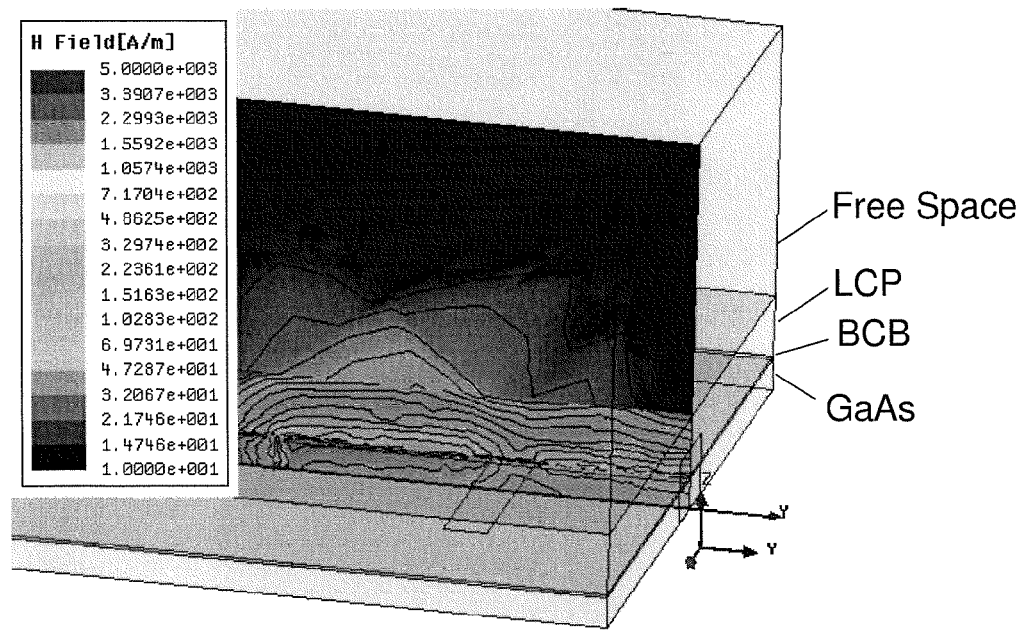
FIG. 20 shows simulation of H field of amplifier circuit showing field fringing into free space within package of FIG. 18 with open cover, and where here the layers above the amplifier circuit are BCB, LCP and free space.

As shown in the magnetic field plots of FIG. 19 (Simulation of H field of amplifier showing confinement of magnetic field within the integrated microwave package. Layers are BCB, LCP, magnetic loaded material (μr=200, ∈r=2.5. thickness=50 um), and free space) and FIG. 20 (Simulation of H field of amplifier showing field fringing into free space in the case of an open boundary. Layers are BCB, LCP and free space.) the addition of the magnetic material results in better confinement of the H field from which ensues lower coupling between input and output and thus suppressed feedback. For a given physical size, the invention may lead to packaged amplifiers with higher gain than previously attainable.

The invention has benefits in other types of microwave circuits including compact phase shifters and attenuators where RMS performance can suffer from coupling effects that are difficult to model and control over wide bandwidth.

The electromagnetic structures on the microcover are accounted for in the design of the MMIC. They prevent unwanted interactions through the shielding they provide. The result of the packing method is an invariant die, both in properties and performance. It is also to be noted that an alternative implementation of the above concept forgoes the need for hermetic sealing of the microcover. Instead, the MMIC is coated with an environmentally impervious coating prior to attachment of the microcover.

The completed structure is shown in FIG. 12.

Figure 22:
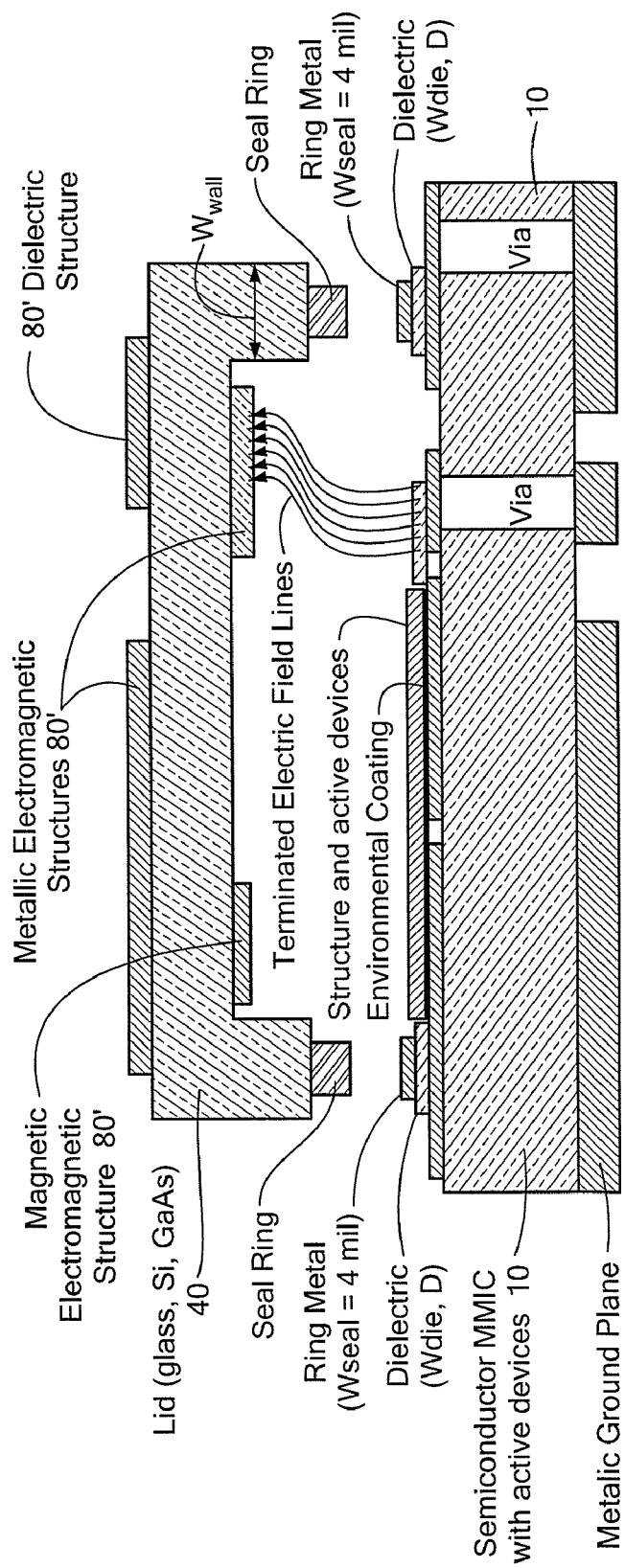
FIG. 22 shows a semiconductor package in accordance with an alternative embodiment of the invention.

Referring now to FIG. 22, a package 10' is provided having an air-cavity "micro-cover" made of quartz or other materials, metalized or otherwise, over the individual die. The microcover, as is known in the art, results in an increase in the size of the conventional microstrip die since a bonding ring must be allowed in the design. Further, leads which emanate from the MMIC must pass under the cover and be terminated on pads placed on a ledge outside the MMIC active area. The ledge must be sufficiently large to allow access of a bonding tool for assembly.

For microstrip MMIC's designs, the active transistors and tuning elements are placed, along with bonding pads, on the top (epitaxial) surface of the die. Bond wires and associated bonding pads within a conventional housing result in an increase in the size of the MMIC as well as an increase in the cost and complexity of the substrates to which they are mounted. In prior art, techniques have been proposed to reduce or eliminate the bond wires by providing through-via connections from the front surface of a MMIC to the back surface. This technique is sometimes referred to as "Through-Wafer-Interconnect", "Hot-Via" or "Direct-Backside-Interconnect". Hot-via designs allow for smaller die and smaller substrates and hence smaller module footprints. Hot-via designs make it easier to route wiring on the MMIC since connection need not be made at the edges of the chip.

Here, as noted above in connection with FIGS. 11 and 12, shapes 80'; of metallic, magnetic or dielectric material are used for reducing or eliminating electromagnetic interactions between the MMIC and the external environment within the a module enclosure. The shapes 80' are printed (e.g., formed lithographically or plated) carefully on the inside and outside surfaces of the microcover 40. These structures 80' terminate radiated fields (as illustrated in FIG. 13) in a known, predictable manner that in effect provide shielding to the MMIC. It is to be noted that an environmental coating is included on the MMIC. This forgoes the need for hermetic sealing of the microcover. Instead, the MMIC is coated with an environmentally impervious coating at the wafer level prior to attachment of the microcover. The addition of electromagnetic tuning elements 80' to both the inside and outside surfaces of the microcover results in shielding of the interior MMIC from the module environment. Modern electro magnetic design approaches can be used to specify the electromagnetic structures at the time of MMIC design. This would remove the uncertainty of the module environment for applications of the MMIC. For example the patterns 80' to be used on the chips are designed using circuit design software. The software is capable of analyzing three-dimensional situations where materials are placed at various positions relative to the transistors on the chip. Procedures would be used wherein the positioning of such materials would lead to the least sensitivity to outside perturbation. There would be minimal sensitivity to the external electromagnetic environment. All of the materials applied to the encapsulated die would be in thin film form. These could be patterned either by photolithograph etching after application or by lift off techniques. Such photolithograph etching techniques are well known in the art.

Figure 21:
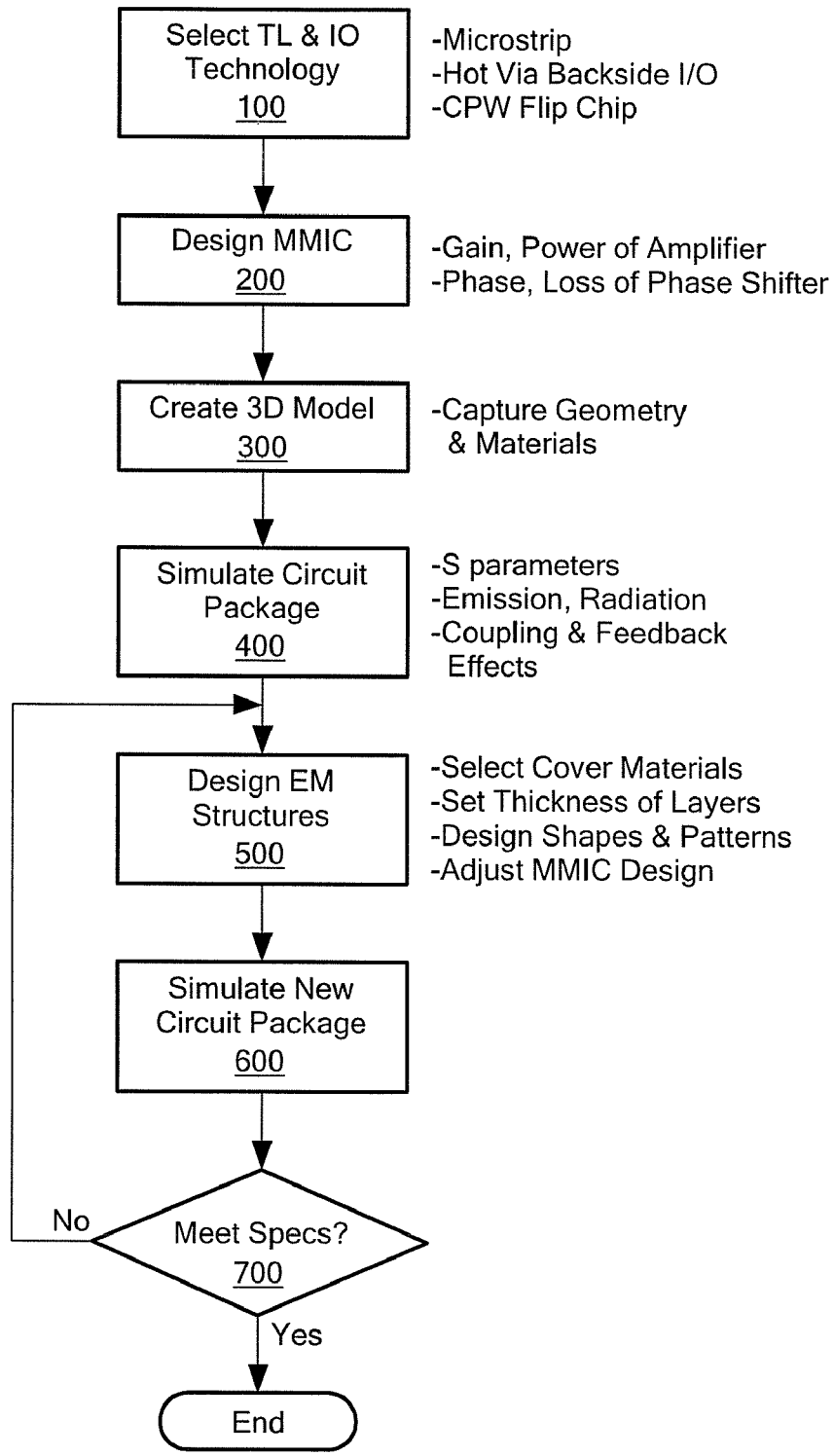
FIG. 21 is a flowchart of the steps used to fabricate a semiconductor package in accordance with an embodiment of the invention the package.

A flowchart of the steps in the method used to fabricate the package, such as the package 10' shown in FIG. 22 with shapes 80'; of metallic., magnetic or dielectric material are used for reducing or eliminating electromagnetic interactions between the MMIC and the external environment within the a module enclosure is shown in FIG. 21. It is noted that shapes 80' (FIG. 22) provide a predetermined magnetic or electric effect for the device solely by electrical or magnetic waves coupled between such shapes 80' and the device as distinguished from forming a circuit on the cover and connecting such circuit to the device with a wire that passes through the cover.

More particularly, referring again to FIG. 21, the method for determining patterns and placement of material, here the shapes 80' (FIG. 22, for example) to provide a predetermined magnetic or electric effect for the device includes:

Step 100. Select the interconnect technologies to be used in the package, for example: Microstrip or Coplanar Waveguide (CPW) transmission line technology; Microstrip face up with hot via backside interconnect; Coplanar face up; CPW flipped with connections trough dielectric layer.

Step 200. Design the MMIC circuit

Step 300. Create a 3D model of integrated microwave package for numerical electromagnetic simulation using Finite Element Method (FEM) or other numerical EM analysis tool capable of analyzing arbitrary 3D structures. Model captures physical dimensions of circuit features electromagnetically interacting with the package. Model captures also dielectric layers and all material properties (relative permittivity and permeability, loss tangent, conductivity).

Step 400. Simulate microwave performance of package circuit without electromagnetic (EM) structures to define baseline performance. EM simulation of package and circuit simulation part of the circuit not captured by EM simulation are tied together into a s single model to simulate circuit in microwave integrated package. Extract evaluation criteria. These include RF emission (radiated power and near field intensity in proximity of package), gain ripple and stability of the circuit embedded in microwave package.

Step 500. Design EM structures. Identify locations for forming EM structures on integrated package. For face up microstrip, the EM structures are applied to the top surface of the dielectric cover. The EM structures can also be formed on the underside of a dielectric layer. The EM structures can be formed on several dielectric layers above the semiconductor substrate. For a flip-chip CPW circuit, the EM structures are patterned in the areas between RF and DC interconnections.

Embodiments of EM structures include, as single elements or in combination:

a. A dielectric layer with high relative permeability ($\mu_r \gg 1$)
      formed on the surface available for receiving the EM structures. The dielectric layer is a thin film, e.g. 50 um thick, of magnetic loaded material (μr=200, ∈r=2.5)

b. A thin film of magnetic material formed on the surface of the dielectric cover.

c. The dielectric layer material can be a blanket of material or it can be deposited selectively or etched after deposition. Selective deposition and etching create specific geometrical shapes and periodic patterns thereof. The type of shapes, their dimensions and the pattern parameters are designed to meet the design specifications of the packaged circuit. The specific dimensions of the EM structures depend on the properties of the available dielectric materials and on the 3D EM field distribution produced by the circuit in the microwave package.

c. The EM structures are strips of dielectric, metal, or magnetic material d. The EM structure is a screen formed by a holes etched in a layer of dielectric, metal, or in a magnetic material.

e. The EM structures are combinations of shapes made from dielectric, metal, or magnetic material on single dielectric layer or on several layers.

Step 600. Simulate new package with numerical EM analysis. Update EM model and simulate performance of circuit in microwave integrated package. Extract relevant evaluation criteria (radiated emission, ripple magnitude, passband distortion, for example)

Step 700. Compare results to baseline. Quantify improvement. Adjust EM structures accordingly and repeat steps until specifications are met.

It should be understood that the electromagnetic effect compensation techniques described herein may be applied to other packages. One such package is shown in FIG. 22.

A number of embodiments of the invention have been described. For example, the material 80' may be patterned with vertical metallic or absorbing structures. An example would be like a picket fence around an area formed by plated circular or rectangular via holes. These would isolate sections of the MMIC to prevent coupling and oscillation. This would allow inclusion of more gain stages on the MMIC. Most of the vertical structures could be connected to top and/or bottom ground planes. Openings in the vertical structures would allow penetration of electrical conductors where desired.

Nevertheless, it will be understood that various modifications may be made without departing from the spirit and scope of the invention. Accordingly, other embodiments are within the scope of the following claims.

What is claimed is:

1. A method for packaging a semiconductor device, such method comprising:
   providing a dielectric layer over the semiconductor device;
   determining patterns and placement of material on the dielectric layer to provide a predetermined magnetic or electric effect for the device, such effects being provided on the device from such patterned and placed material solely by electrical or magnetic waves coupled between such material and the device; and
   forming the material in the determined patterns and placement to provide the predetermined effects.

2. The method recited in claim 1 wherein the dielectric layer is a rigid dielectric layer suspended over the device.

3. A method for packaging a plurality of semiconductor devices formed in a surface portion of a semiconductor wafer, each one of a plurality of regions within the wafer having one of the semiconductor devices therein, such method comprising:
   providing a dielectric layer over the wafer;
   depositing a material on the dielectric layer, such material effecting electromagnetic fields on each one of the devices;
   separating each one of the devices within the wafer.

4. The method recited in claim 3 wherein the dielectric layer is a ridged dielectric layer with portions thereof suspended over the devices.

5. The method recited in claim 3 wherein the material is magnetic material.

6. The method recited in claim 5 wherein the material is metal.

* * * * *